(12) United States Patent
Tzeng et al.

(10) Patent No.: US 8,461,511 B2
(45) Date of Patent: Jun. 11, 2013

(54) PHOTO-SENSITIVE COMPOSITE FILM, METHOD OF FABRICATING THE SAME, AND PHOTO-SWITCHED DEVICE COMPRISING THE SAME

(75) Inventors: Yon-Hua Tzeng, Tainan (TW); Chih-Yi Liu, New Taipei (TW); Kyaw-Oo Kyaw, Tainan (TW); Hsiang-Chen Chui, Taichung (TW); Chen-Han Huang, Tainan (TW); Hsing-Ying Lin, Kaohsiung (TW)

(73) Assignee: National Cheng Kung University, Tainan (TW)

( * ) Notice: Subject to any disclaimer, the term of this patent is extended or adjusted under 35 U.S.C. 154(b) by 192 days.

(21) Appl. No.: 13/209,559

(22) Filed: Aug. 15, 2011

(65) Prior Publication Data

US 2012/0037792 A1    Feb. 16, 2012

(30) Foreign Application Priority Data

Aug. 16, 2010  (TW) ............................. 99127349 A
Sep. 24, 2010  (TW) ............................. 99132361 A

(51) Int. Cl.
*C25D 1/00* (2006.01)
*B82Y 40/00* (2011.01)

(52) U.S. Cl.
USPC ................ 250/216; 250/214.1; 250/214 SW; 977/773; 977/781

(58) Field of Classification Search
USPC ..... 250/214 R, 214.1, 214 SW, 216; 977/708, 977/773, 781, 810; 205/77, 79; 356/244, 356/301
See application file for complete search history.

(56) References Cited

U.S. PATENT DOCUMENTS

2012/0194813 A1 *  8/2012  Tzeng et al. ................. 356/301

OTHER PUBLICATIONS

Chen-Han Huang; Plasmon-Induced Optical Switching of Electrical Conductivity in Porous Anodic Aluminum Oxide Films Encapsulated with Silver Nanoparticle Arrays; Optics Express; Dec. 17, 2010; p. 27891-p. 27899; vol. 18, No. 26; 2010 Optical Society of America.

* cited by examiner

*Primary Examiner* — Kevin Pyo
(74) *Attorney, Agent, or Firm* — Bacon & Thomas, PLLC

(57) ABSTRACT

A photo-sensitive composite film is disclosed, which includes plural metal nano-particles and a porous anodized aluminum oxide film. The nanoparticles can be hollow or solid with unrestricted shapes of varying diameters and lengths. The plural metal nanoparticles are completely contained in holes and attached to the bottom of the holes of the anodized aluminum oxide film, and the electrical conductivity of the photo-sensitive anodized aluminum oxide film can be changed by light exposure on the metal nanoparticles from surfaces of the anodized aluminum oxide film. The structure of the photo-sensitive anodized aluminum oxide film of the present invention is uncomplicated and the manufacturing steps thereof are simple, and therefore the photo-sensitive anodized aluminum oxide film of the present invention is of great commercial value. Also, a method of manufacturing the above photo-sensitive composite film and a photo-switched device including the same are disclosed.

13 Claims, 5 Drawing Sheets

PHOTO-SENSITIVE COMPOSITE FILM, METHOD OF FABRICATING THE SAME, AND PHOTO-SWITCHED DEVICE COMPRISING THE SAME

CROSS REFERENCE TO RELATED APPLICATION

This application claims the benefits of the Taiwan Patent Application Serial Number 099127349, filed on Aug. 16, 2010, and the Taiwan Patent Application Serial Number 099132361, filed on Sep. 24, 2010, the subject matters of which are incorporated herein by reference.

BACKGROUND OF THE INVENTION

1. Field of the Invention

The present invention relates to a photo-sensitive composite film, a method for fabricating the same and a photo-switched device comprising the same, more particularly, to a photo-sensitive composite film comprising a plurality of metal nanoparticles and an anodized porous aluminum oxide film, a method for fabricating the same and a photo-switched device comprising the same.

2. Description of Related Art

Photoconductivity is a phenomenon in which a material has enhanced electrical conductivity (or reduced resistance) due to the absorption of specific spectra upon being irradiated by light. Photo-sensitive composite materials have great potential for development, and thus researchers have shown great interest in the investigation of photoconductivity of nanocomposites. For example, silica nanowires embedded with gold nanoparticles, which can show photoconductivity upon illumination by light of specific wavelengths, have been developed as a kind of photoconductive material. It has been proposed that the enhanced conductance is caused by hot electrons induced by plasmonic coupling in the metal nanoparticles, resulting in the photoconductivity phenomenon.

Photoconductive materials can be widely applied in, for example, photosensors, photo-switches, photosensitive resistances, sensors for digital cameras, photodetectors for monitor color adjustment, light sensor sound chips, electrography copiers, printers or outdoor auto lighting equipment. The photoconductive materials can be widely applied in present and future electric products, and thus have high economic worth.

However, the photoconductive materials that have been developed in the art are finite and require high-cost and complicated manufacturing methods, and it is difficult to control them in uniform conditions over a two dimensional surface. Therefore, it is desirable to provide a photoconductive material with a novel structure and a method for manufacturing the same to simplify the manufacturing process, shorten manufacturing time, reduce manufacturing cost, show excellent photoconductivity, and thus overcome the above-mentioned difficulties.

SUMMARY OF THE INVENTION

The present invention provides a photo-sensitive composite film, which includes a plurality of metal nanoparticles and an anodized aluminum oxide film. Herein, the anodized aluminum oxide film is made of a porous material with nanopores, and has a first surface and a second surface opposite to the first surface. In addition, the anodized aluminum oxide film has a plurality of long tube shaped holes. Each hole has a first end and a second end. The first end has an opening at the first surface of the anodized aluminum oxide film, while the second end of the hole is closed and located at the second surface of the anodized aluminum oxide film. The closed second end is covered by a compact aluminum oxide layer. And, the plural metal nanoparticles are completely contained in the holes and in touch with the bottom of the holes (i.e. the second end of the holes). Accordingly, the electrical conductivity of the photo-sensitive composite film can be changed by exposure of metal nanoparticles to light from the first surface or/and the second surface of the anodized aluminum oxide film.

The photo-sensitive composite film of the present invention has a novel and simple structure, and can be manufactured by a simple method. In particular, the suitable activation wavelength for irradiation can be modified by altering the material of metal nanoparticles, the hole size of the anodized aluminum oxide film, and/or the size of the metal nanoparticles, and thus high variability is achieved. The photo-sensitive composite film according to the present invention has a quite simple structure and can be manufactured by a simple method, and the materials for preparing the composite film can be easily obtained. Therefore, the photo-sensitive composite film of the present invention is of great commercial value.

In the photo-sensitive composite film of the present invention, each hole preferably has a specific depth, and the depth is preferably larger than the diameter of the metal nanoparticles to make the metal nanoparticles completely contained in the holes and reside at the bottom of the holes. The photo-sensitive composite film of the present invention has a two-dimensional photoconductivity structure. Most preferably, each hole of the anodized aluminum oxide film contains a metal nanoparticle. However, the influence on two-dimensional photoconductivity due to a few holes containing no metal nanoparticles therein is not great. That is, even if a few holes contain no metal nanoparticles, the photo-sensitive composite film according to the present invention still exhibits its two-dimensional photoconductivity.

In the photo-sensitive composite film of the present invention, the opening diameter of the hole preferably ranges from 10 nm to 400 nm. And, the opening diameter of the hole is determined by the anodic oxidation voltage and the etching process using an etching solution to enlarge the hole diameter.

In the photo-sensitive composite film of the present invention, the hole depth of the film depends on the time of the anodic oxidation step, and can range from tens of nanometers to several millimeters.

In the photo-sensitive composite film of the present invention, the diameter of the metal nanoparticle preferably ranges from 10 nm to 400 nm.

In the photo-sensitive composite film of the present invention, the metal nanoparticles can be hollow or solid with unrestricted shapes varing from, for example, spherical, hemispherical, elliptical, square, to rods of varying diameters and lengths. In addition, the metal nanoparticles preferably are made of silver, gold, copper, nickel, chromium, tungsten, platinum, aluminum or other metals or an alloy of the above-mentioned metals, more preferably are silver or gold, and most preferably are silver.

Preferably, the photo-sensitive composite film of the present invention further includes a passivation layer, which covers the first surface of the anodized aluminum oxide film.

In the photo-sensitive composite film of the present invention, the wavelength for irradiation would vary according to the kind of metal.

The present invention further provides a method for fabricating a photo-sensitive composite film, which includes: (A)

providing an aluminum plate; (B) performing an anodizing treatment on the aluminum plate to form an anodized aluminum oxide film on a surface of the aluminum plate, in which the anodized aluminum oxide film is made of a porous material with nano-pores and has a first surface, a second surface opposite to the first surface and a plurality of long tube shaped holes, and each of the holes has a first end and a second end, therewith the first end having an opening at the first surface of the anodized aluminum oxide film, the second end of the hole being closed and located at the second surface of the anodized aluminum oxide film, and the closed second end being covered by an aluminum oxide layer; (C) growing metal nanoparticles in the holes of the anodized aluminum oxide film to make the metal nanoparticles completely contained in the holes and attached to the bottom of the holes; and (D) removing the aluminum plate.

The photo-sensitive composite film according to the present invention has a quite simple structure and can be manufactured by a simple method, and the materials for preparing the composite film can be easily obtained. Therefore, the photo-sensitive composite film of the present invention is of great commercial value. In particular, the irradiation wavelength suitable for the photo-sensitive composite film of the present invention can be modified by altering the material of metal nanoparticles, and the hole size of the anodized aluminum oxide film, and thus high variability is achieved.

In the method for fabricating a photo-sensitive composite film according to the present invention, the metal nanoparticles preferably are formed by electrodeposition in the step (C).

Preferably, the method for fabricating a photo-sensitive composite film according to the present invention further includes a step (B1) after the step (B): placing the anodized aluminum film into an etching solution to enlarge the opening diameter of the hole. Herein, examples of the etching solution may include phosphoric acid aqueous solution or other acid solution.

In the method for fabricating a photo-sensitive composite film according to the present invention, alternating current or direct current may be used in the electrodeposition process. The electrodeposition process is not particularly limited.

In the method for fabricating a photo-sensitive composite film according to the present invention, the voltage for the electrodeposition process preferably ranges from 5 V to 200 V. The voltage for the electrodeposition process is determined according to the kind of metal. For example, the voltage for silver electrodeposition is preferably 15V, and the voltage for gold electrodeposition is preferably 45V.

In the method for fabricating a photo-sensitive composite film according to the present invention, preferably, the material of the metal nanoparticles is selected from the group consisting of silver, gold, copper, nickel, chromium, tungsten, platinum, aluminum and an alloy thereof. In addition, the metal nanoparticles can be hollow or solid with unrestricted shapes varing from, for example, spherical, hemispherical, elliptical, square, to rods of varying diameters and lengths.

Preferably, the method for fabricating a photo-sensitive composite film according to the present invention further includes a step (E) after the step (C): forming a passivation layer over the first surface of the anodized aluminum oxide film.

Preferably, the method for fabricating a photo-sensitive composite film according to the present invention further includes a step (F) after the step (D): thinning the anodized aluminum oxide film on the second surface to reduce the thickness of the aluminum oxide layer covering metal nanoparticles having been deposited at the bottom of the closed holes.

In the method for fabricating a photo-sensitive composite film according to the present invention, preferably, the electrical conductivity of the photo-sensitive composite film is changed by light exposure on the metal nanoparticles from the second surface or/and the first surface, and preferably on the second surface, of the photo-sensitive composite film through transparent aluminum oxide.

In the method for fabricating a photo-sensitive composite film according to the present invention, the wavelength for irradiation would vary according to the kind of metal.

In the method for fabricating a photo-sensitive composite film according to the present invention, the opening diameter of the hole in the step (B) preferably ranges from 10 nm to 400 nm.

In the method for fabricating a photo-sensitive composite film according to the present invention, the depth of the hole in the step (B) preferably ranges from tens of nanometers to thousands of micrometers. The thickness of the anodized aluminum oxide film is directly proportional to the time of the anodized oxidation process, e.g. about 2.5 μm/hour under oxalic acid with 40 V applied voltage. It changes with different electrolytes or applied voltage.

In the method for fabricating a photo-sensitive composite film according to the present invention, the diameter of the metal nanoparticle in the step (C) preferably ranges from 10 nm to 400 nm.

The present invention further provides a photo-switched device, which includes: a photo-sensitive composite film including a plurality of metal nanoparticles and an anodized aluminum oxide film in which the anodized aluminum oxide film is made of a porous material with nano-pores and has a first surface, a second surface opposite to the first surface and a plurality of long tube shaped holes, and each of the holes has a first end and a second end, therewith the first end having an opening at the first surface of the anodized aluminum oxide film, the second end of the hole being closed and located at the second surface of the anodized aluminum oxide film, the closed second end being covered by an aluminum oxide layer, the plural metal nanoparticles being completely contained in the holes and residing at the bottom of the holes, and the photo-sensitive composite film being capable of changing its electrical conductivity by light exposure on the metal nanoparticles from the first surface or/and the second surface of the transparent anodized aluminum oxide film; and at least two electrodes, which are connected to the anodized aluminum oxide film, in which the photo-switched device is capable of changing its resistance upon being irradiated by light. Herein, the electrodes are not particularly limited, and may be metal electrodes.

The photo-switched device of the present invention includes a photo-sensitive composite film with a novel and simple structure. The photo-sensitive composite film can be manufactured by a simple method. In particular, the suitable wavelength for irradiation can be modified by altering the material of metal nanoparticles, the hole size of the anodized aluminum oxide film, and/or the size of the metal nanoparticles, and thus high variability is achieved. The photo-switched device according to the present invention has a quite simple structure and can be manufactured by a simple method, and the materials for preparing the photo-switched device can be easily obtained. Therefore, the photo-switched device of the present invention is of great commercial value.

In the photo-switched device of the present invention, at least two electrodes may be formed over the second surface of the anodized aluminum oxide film. Alternatively, the electrodes may be formed over the first surface of the anodized aluminum oxide film. It is preferable to minimize the distance between the electrodes and the metal nanoparticles, and most preferable to have the electrodes contact with the metal nanoparticles. Thus, the thickness of the anodized aluminum oxide film may be modified according to the above-mentioned requirement.

In the photo-switched device of the present invention, a thin dielectric layer may be disposed over the first surface of the anodized aluminum oxide film in the remaining region with no electrodes. It is preferable to minimize the distance between the dielectric layer and the metal nanoparticles, and most preferable to have the dielectric layer contact with the metal nanoparticles.

In the photo-switched device of the present invention, the opening diameter of the hole preferably ranges from 10 nm to 400 nm.

In the photo-switched device of the present invention, the depth of the hole preferably ranges from tens of nanometers to thousands of micrometers.

In the photo-switched device of the present invention, the diameter of the metal nanoparticle preferably ranges from 10 nm to 400 nm.

BRIEF DESCRIPTION OF THE DRAWINGS

FIG. 3 shows photoconductance for different excitations on the AAO substrates, in which shaded (excitation wavelength $\lambda_R$=633 nm, $\lambda_G$=532 nm, $\lambda_B$=405 nm) and unshaded regions mark the light-on and light-off periods, respectively; and.

DETAILED DESCRIPTION OF THE PREFERRED EMBODIMENT

Example 1

Figure 1A:
FIGS. 1A to 1D show a process for manufacturing a photo-sensitive composite film according to one preferred example of the present invention.
Figure 1B:
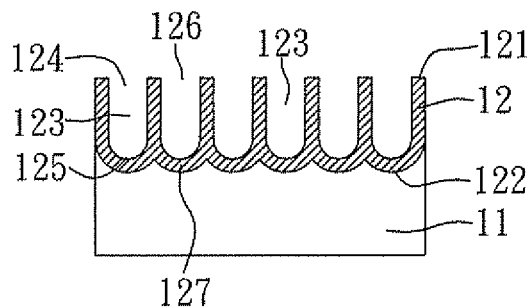
Figure 1C:
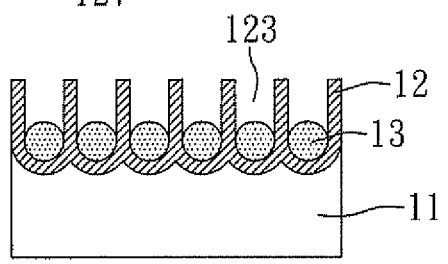
Figure 1D:
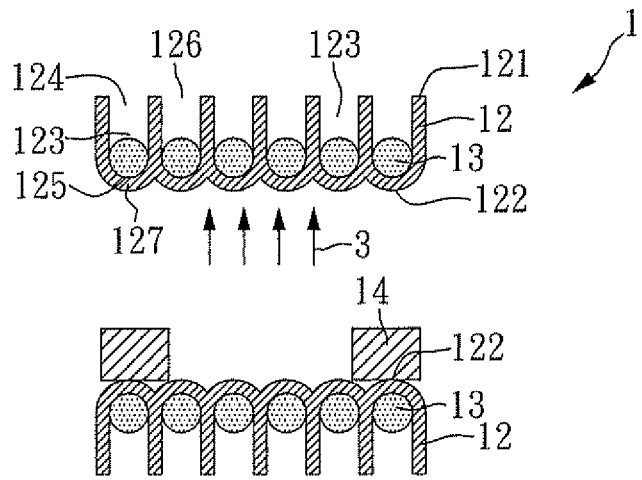

FIGS. 1A to 1D show a process to manufacture a photo-sensitive composite film according to the present example. As shown in FIG. 1A, an aluminum plate 11 is first provided in the step (A). Then, as shown in FIG. 1B, the aluminum plate 11 is subjected to an anodizing treatment to form an aluminum oxide film 12 on the surface of the aluminum plate 11 in the step (B). The film 12 is made of a porous material with nano-pores, and has a first surface 121 and a second surface 122 opposite to the first surface 121. In addition, the anodized aluminum oxide film 12 has a plurality of long tube shaped holes 123. Each of the holes 123 has a first end 124 and a second end 125. The first end 124 has an opening 126 at the first surface 121 of the anodized aluminum oxide film 12, while the second end 125 of the hole 123 is closed and located at the second surface 122 of the anodized aluminum oxide film 12. The closed second end 125 is covered by an aluminum oxide layer 127. Subsequently, as shown in FIG. 1C, through electrodeposition, silver metal nanoparticles 13 are grown in the holes 123 of the anodized aluminum oxide film 12 under an alternating current of 15 V in the step (C). Herein, the silver metal nanoparticles 13 are completely contained in the holes 123 and at the bottom of the holes 123. And, as shown in FIG. 1D, the aluminum plate 11 is removed by an etching process in the step (D).

Figure 2A:
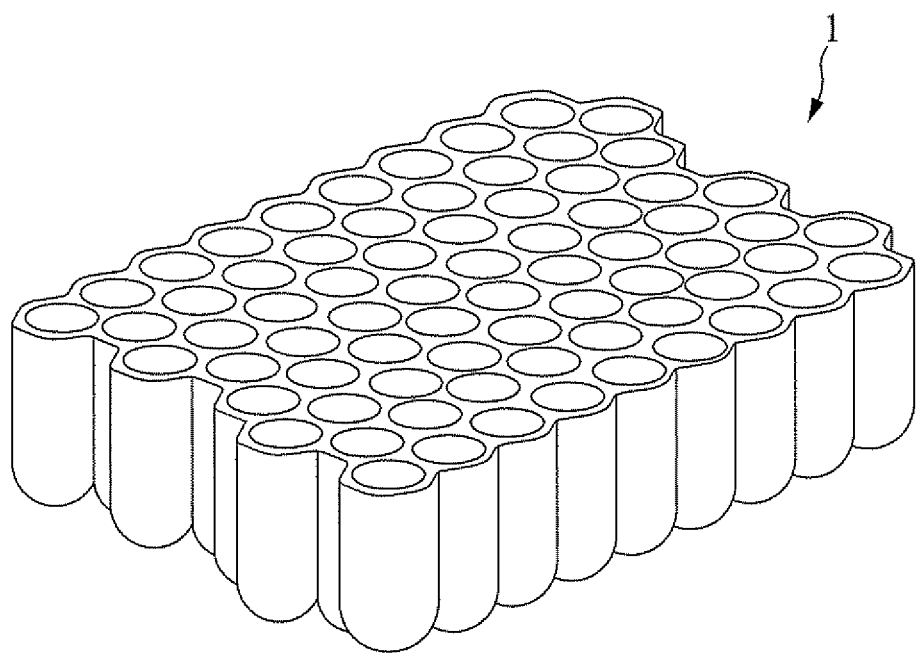
FIG. 2A shows a perspective view of a photo-sensitive composite film according to one preferred example of the present invention.

FIGS. 1D and 2A show a photo-sensitive composite film 1 manufactured by the present example. The photo-sensitive composite film 1 according to the present example includes a plurality of silver metal nanoparticles 13 and an anodized aluminum oxide film 12. The anodized aluminum oxide film 12 is made of a porous material with nano-pores, and has a first surface 121 and a second surface 122 opposite to the first surface 121. In addition, the anodized aluminum oxide film 12 has a plurality of long tube shaped holes 123. Each of the holes 123 has a first end 124 and a second end 125. The first end 124 has an opening 126 at the first surface 121 of the anodized aluminum oxide film 12, while the second end 125 of the hole 123 is closed and located at the second surface 122 of the anodized aluminum oxide film 12. The closed second end 125 is covered by an aluminum oxide layer 127, and the silver metal nanoparticles 13 are completely contained in the holes 123 and at the bottom of the holes 123. The silver nanoparticles can be hollow or solid with unrestricted shapes varing from, for example, spherical, hemispherical, elliptical, square, to rods of varying diameters and lengths. Accordingly, the conductivity of the photo-sensitive composite film 1 can be changed upon metal nanoparticles being irradiated by light 3 though the transparent anodized aluminum oxide film from the second surface 122 or the first surface 121 of the anodized aluminum oxide film.

In the present example, each hole 123 has a specific depth, and the depth is larger than the diameter of the silver metal nanoparticle to make the silver metal nanoparticle be completely contained in the hole. The hole contains a metal nanoparticle and has an opening of 40 nm in diameter. The hole depth of the anodized aluminum oxide film depends on the time of the anodic oxidation process. Thus, the depth can range from tens of nanometers to tens of micrometers.

Figure 2B:
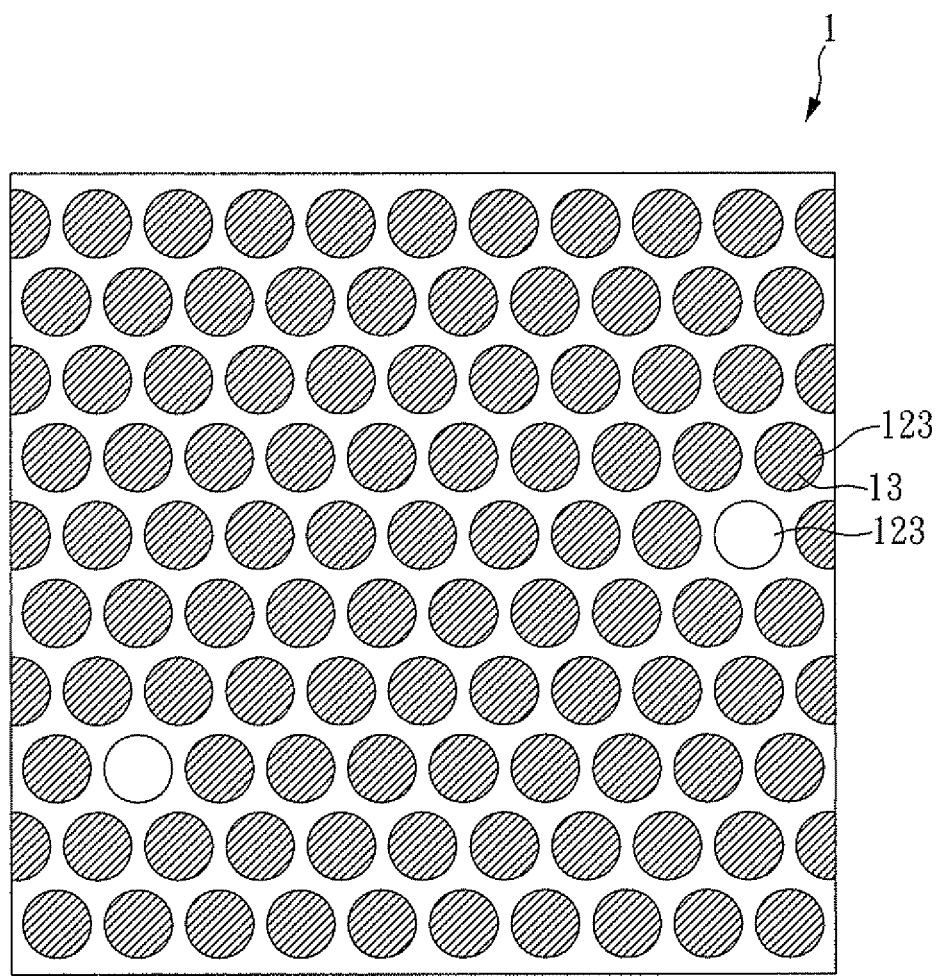
FIG. 2B shows a top view of a photo-sensitive composite film according to one preferred example of the present invention.

FIG. 2B shows a top view of the photo-sensitive composite film according to the present example. As shown in FIG. 2B, most holes 123 contain a silver metal nanoparticle 13 therein, while a few holes 123 contain no silver metal nanoparticle 13 therein. However, the influence on two-dimensional photoconductivity due to those few holes 123 containing no silver metal nanoparticle 13 therein is not great. That is, even if a few holes 123 contain no metal nanoparticle 13, the photo-sensitive composite film according to the present invention still exhibits two-dimensional photoconductivity.

Example 2

The photo-sensitive composite film according to the present example is manufactured by the same process as illustrated in Example 1, except that gold metal nanoparticles (rather than silver metal nanoparticles) are grown in the holes of the anodized aluminum oxide film under a voltage of 45 V in the step (C). Since the material of the metal nanoparticles in the holes according to the present example is different from that of Example 1, the light wavelength required by the photo-sensitive composite film according to the present example to induce conductivity is different from that required in Example 1.

Example 3

Figure 1E:
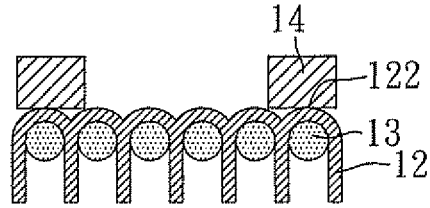
FIG. 1E shows a perspective view of a photo-sensitive composite film according to another preferred example of the present invention.

After a photo-sensitive composite film 1 is manufactured by the same method as illustrated in Example 1, a step (D1) of forming two electrodes 14 on the second surface 122 of the anodized aluminum oxide film 12 is performed, as shown in FIG. 1E. These electrodes 14 can provide the photo-sensitive composite film 1 with external electrical connection.

Example 4

Figure 1F:
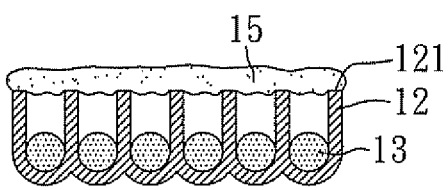
FIG. 1F shows a perspective view of a photo-sensitive composite film according to yet another preferred example of the present invention.

After a photo-sensitive composite film 1 is manufactured by the same method as illustrated in Example 1, a step (E) of forming a passivation layer 15 on the first surface 121 of the anodized aluminum oxide film 12 is performed, as shown in FIG. 1F. The passivation layer 15 can protect the metal nanoparticles 13 in the holes 123 from being oxidized or prevent moisture and impurities from entering the holes.

Example 5

Figure 2C:
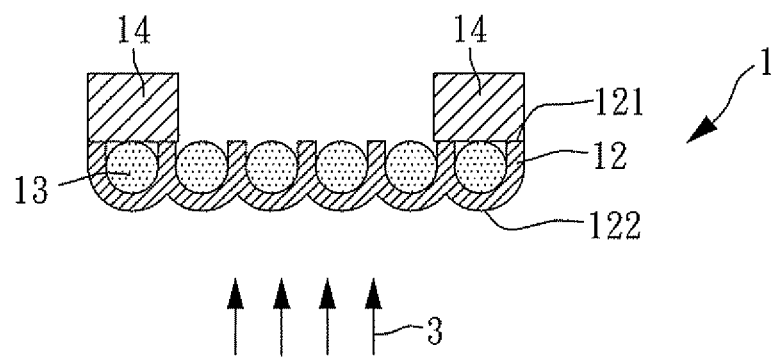
FIG. 2C shows a perspective view of a photo-sensitive composite film according to another preferred example of the present invention.

As shown in FIG. 2C, a photo-sensitive composite film 1 is manufactured by the same process as illustrated in Example 3, except that two electrodes 14 are formed on the first surface 121 of the anodized aluminum oxide film 12, rather than the second surface 122. These electrodes 14 can provide the photo-sensitive composite film 1 with external electrical connection. It should be noted that it is preferable to minimize the distance between the electrodes 14 and the metal nanoparticles 13, and most preferable to have the electrodes 14 contact with the metal nanoparticles 13, in the case of the electrodes 14 being formed on the first surface 121 of the anodized aluminum oxide film 12. Thus, the thickness of the anodized aluminum oxide film 12 should be modified according to the above-mentioned requirement.

Example 6

Figure 2D:
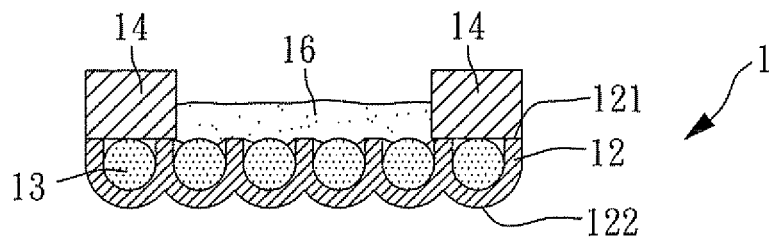
FIG. 2D shows a perspective view of a photo-sensitive composite film according to yet another preferred example of the present invention.

As shown in FIG. 2D, after a photo-sensitive composite film 1 is manufactured by the same method as illustrated in Example 1, a step (F) of forming a thin dielectric layer 16 on the first surface 12 of the anodized aluminum oxide film 12 and then forming two electrodes 14 is performed. In the present example, it should be noted that it is preferable to minimize the distance between the dielectric layer 16 and the metal nanoparticles 13, and most preferable to have the dielectric layer 16 contact with the metal nanoparticles 13.

Test Example

Figure 3:
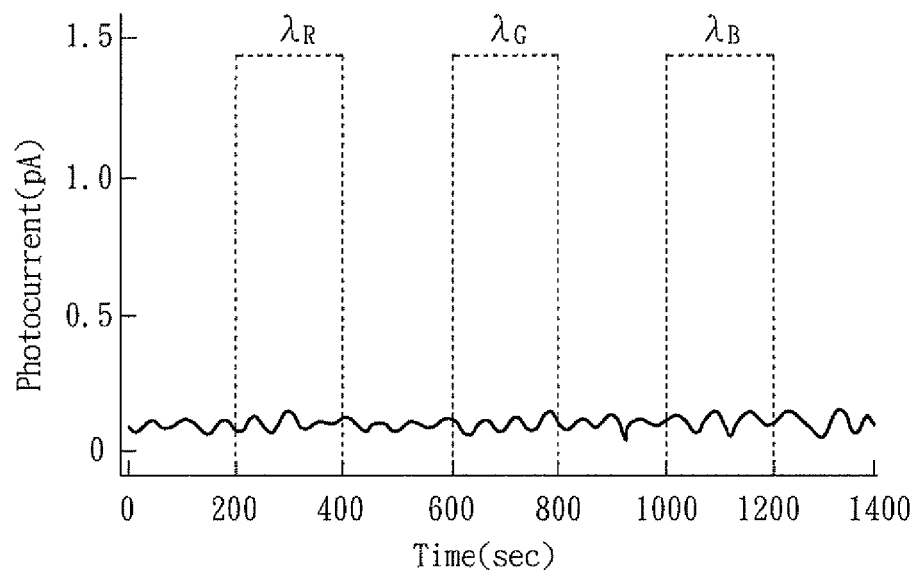
Figure 4:
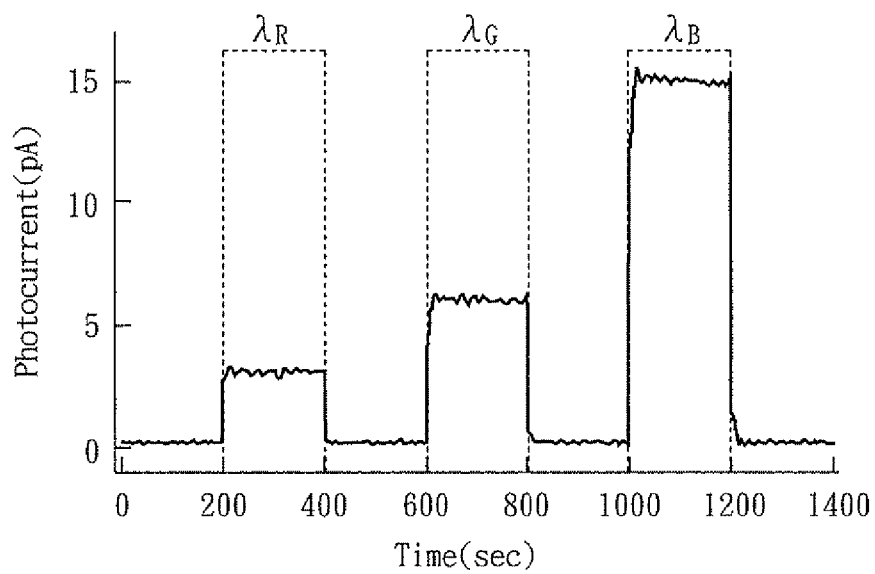
FIG. 4 shows photoconductance for different excitations on the Ag/AAO substrates, in which shaded (excitation wavelength $\lambda_R$=633 nm, $\lambda_G$=532 nm, $\lambda_B$=405 nm) and unshaded regions mark the light-on and light-off periods, respectively.

The dependence of incident wavelength on the dynamic photocurrent variation was investigated. FIGS. 3 and 4 depict the optically induced current ($I_{AAO}$ or $I_{Ag/AAO}$) separately measured on the AAO (anodized aluminum oxide) and Ag/AAO substrates as a function of time to laser illuminations. With a spot diameter of around 22 μm, the light intensity ($P_{R, G\ and\ B}$) was on the order of 2.63 μW/μm² for all wavelengths. As can be seen, during irradiation with 405 nm laser ($\lambda_R$), the response current of Ag/AAO substrate increased about two point five-fold than irradiation with 532 nm ($\lambda_G$), and about five-fold than irradiation with 633 nm ($\lambda_B$). However, the response current of empty AAO substrate was barely changed from the dark current over time even for an illumination period of several minutes. On the Ag/AAO substrate, the current sharply rose under excitations, and then instantly returned to the initial value after the laser source was turned off. The comparative results confirmed that the induced photocurrent of Ag/AAO film under laser illuminations could be attributed to the presence of Ag nanoparticles and the corresponding resonance excitation of embedded Ag nanoparticles. In addition, the higher current value (15 pA) at 405-nm excitation suggested that surface plasmons play an important role in the creation of photoconductance.

In conclusion, the photo-sensitive composite film of the present invention has a novel and simple structure, and can be manufactured by a simple method. In particular, the suitable wavelength for irradiation can be modified by altering the material of metal nanoparticles, the hole size of the anodized aluminum oxide film, and/or the size of the metal nanoparticles, and thus high variability is achieved. Also, a photo-switched device including the photo-sensitive composite film of the present invention has the above-mentioned advantages. The photo-sensitive composite film according to the present invention has a quite simple structure and can be manufactured by a simple method, and therefore it is of great commercial value.

The above examples are intended for illustrating the embodiments of the subject invention and the technical features thereof, but not for restricting the scope of protection of the subject invention. The scope of the subject invention is based on the claims as appended.

What is claimed is:

1. A photo-sensitive composite film comprising a plurality of metal nanoparticles and an anodized aluminum oxide film, wherein the anodized aluminum oxide film is made of a porous material with nano-pores and has a first surface, a second surface opposite to the first surface and a plurality of long tube shaped holes, therewith each of the holes having a first end and a second end, the first end having an opening at the first surface of the anodized aluminum oxide film, the second end of the hole being closed and located at the second surface of the anodized aluminum oxide film, the closed second end being covered by an aluminum oxide layer, and the plural metal nanoparticles being completely contained in the holes and resting at the bottom of the holes; and the photo-sensitive composite film is capable of changing its conductivity by light exposure on the metal nanoparticles from one or both of the first surface and the second surface of the anodized aluminum oxide film.

2. The photo-sensitive composite film as claimed in claim 1, wherein the opening of the hole ranges from 10 nm to 400 nm in diameter.

3. The photo-sensitive composite film as claimed in claim 1, wherein the metal nanoparticles range from 10 nm to 400 nm in diameter.

4. The photo-sensitive composite film as claimed in claim 1, wherein the metal nanoparticles are made of a material selected from the group consisting of silver, gold, copper, nickel, chromium, tungsten, platinum, aluminum and an alloy thereof.

5. A method for fabricating a photo-sensitive composite film, comprising:

(A) providing an aluminum plate;

(B) performing an anodizing treatment on the aluminum plate to form an anodized aluminum oxide film on a surface of the aluminum plate, wherein the anodized aluminum oxide film is made of a porous material with nano-pores and has a first surface, a second surface opposite to the first surface and a plurality of long tube shaped holes, and each of the holes has a first end and a second end, therewith the first end having an opening at the first surface of the anodized aluminum oxide film, the second end of the hole being closed and located at the second surface of the anodized aluminum oxide film, and the closed second end being covered by an aluminum oxide layer;

(C) growing metal nanoparticles in the holes of the anodized aluminum oxide film to make the metal nanoparticles be completely contained in the holes and attached to the bottom of the holes; and (D) removing the aluminum plate.

6. The method for fabricating a photo-sensitive composite film as claimed in claim 5, wherein the metal nanoparticles in the step (C) are formed by an electrodeposition process.

7. The method for fabricating a photo-sensitive composite film as claimed in claim 6, further comprising a step of (B1) after the step (B): placing the anodized aluminum film into an etching solution to enlarge the diameter of the opening of the hole.

8. The method for fabricating a photo-sensitive composite film as claimed in claim 5, wherein the metal nanoparticles are made of a material selected from the group consisting of silver, gold, copper, nickel, chromium, tungsten, platinum, aluminum and an alloy thereof.

9. The method for fabricating a photo-sensitive composite film as claimed in claim 5, wherein the photo-sensitive composite film is capable of changing its conductivity by light exposure on the metal nanoparticles from one or both of the first surface and the second surface of the anodized aluminum oxide film.

10. The method for fabricating a photo-sensitive composite film as claimed in claim 5, wherein the opening of the hole in the step (B) ranges from 10 nm to 400 nm in diameter.

11. A photo-switched device, comprising:

a photo-sensitive composite film comprising a plurality of metal nanoparticles and an anodized aluminum oxide film, wherein the anodized aluminum oxide film is made of a porous material with nano-pores and has a first surface, a second surface opposite to the first surface and a plurality of long tube shaped holes, and each of the holes has a first end and a second end, therewith the first end having an opening at the first surface of the anodized aluminum oxide film, the second end of the hole being closed and located at the second surface of the anodized aluminum oxide film, the closed second end being covered by an aluminum oxide layer, the plural metal nanoparticles being completely contained in the holes and residing at the bottom of the holes, and the photo-sensitive composite film being capable of changing its electrical conductivity by light exposure on the metal nanoparticles from one or both of the first surface and the second surface of the anodized aluminum oxide film; and at least two electrodes connected to the anodized aluminum oxide film, wherein the photo-switched device is capable of changing its resistance upon being irradiated by light.

12. The photo-switched device as claimed in claim 11, wherein the opening of the hole ranges from 10 nm to 400 nm in diameter.

13. The photo-switched device as claimed in claim 11, wherein the metal nanoparticles range from 10 nm to 400 nm in diameter.

* * * * *